United States Patent
Ohmi et al.

(10) Patent No.: US 8,308,897 B2
(45) Date of Patent: Nov. 13, 2012

(54) PLASMA PROCESSING APPARATUS AND PLASMA PROCESSING METHOD

(75) Inventors: Tadahiro Ohmi, Miyagi (JP); Kazuhide Ino, Kyoto (JP); Takahiro Arakawa, Kyoto (JP)

(73) Assignees: Rohm Co., Ltd., Kyoto (JP); Tadahiro Ohmi, Miyagi (JP)

( * ) Notice: Subject to any disclaimer, the term of this patent is extended or adjusted under 35 U.S.C. 154(b) by 1448 days.

(21) Appl. No.: 09/864,376

(22) Filed: May 25, 2001

(65) Prior Publication Data

US 2002/0020498 A1     Feb. 21, 2002

(30) Foreign Application Priority Data

May 26, 2000    (JP) ................................. 2000-156535

(51) Int. Cl.
     *C23C 16/511*      (2006.01)
     *C23F 1/00*      (2006.01)
     *H01L 21/306*      (2006.01)
     *B44C 1/22*      (2006.01)
     *C03C 15/00*      (2006.01)
     *H05H 1/30*      (2006.01)
     *H05H 1/46*      (2006.01)
     *C23C 16/06*      (2006.01)
     *C23C 16/22*      (2006.01)

(52) U.S. Cl. .... 156/345.41; 118/723 MW; 118/723 AN; 216/69; 427/575; 427/595

(58) Field of Classification Search ............ 118/723 AN, 118/723 MW, 715, 723 I, 723 MA, 723 MR, 118/723 R; 156/345.41, 345.27, 345.33, 156/345.35, 345.36, 345.37, 345.48, 345.51, 156/345.53, 345.54, 345.42; 219/121.36, 219/121.41, 121.43, 121.48, 121.52, 121.55; 216/69; 427/575, 595
See application file for complete search history.

(56) References Cited

U.S. PATENT DOCUMENTS

| | | | | |
|---|---|---|---|---|
| 4,676,194 A * | 6/1987 | Satou et al. | ................... | 118/621 |
| 4,985,109 A * | 1/1991 | Otsubo et al. | ................ | 118/50.1 |
| 5,134,965 A * | 8/1992 | Tokuda et al. | ........ | 118/723 MW |
| 5,342,472 A * | 8/1994 | Imahashi et al. | .......... | 118/723 R |
| 5,861,601 A * | 1/1999 | Sato et al. | ................ | 204/298.37 |
| 5,955,382 A | 9/1999 | Yamauchi et al. | | |
| 6,059,922 A | 5/2000 | Yamazaki et al. | | |
| 6,109,208 A * | 8/2000 | Tsuchihashi et al. | . . | 118/723 MA |
| 6,172,321 B1 * | 1/2001 | Yoshioka et al. | ...... | 118/723 MR |
| 6,357,385 B1 * | 3/2002 | Ohmi et al. | ........... | 118/723 MW |
| 6,376,795 B1 * | 4/2002 | Zola | | |
| 6,376,796 B2 * | 4/2002 | Sato et al. | ................ | 219/121.36 |
| 6,830,652 B1 * | 12/2004 | Ohmi et al. | .............. | 156/345.41 |

FOREIGN PATENT DOCUMENTS

| | | |
|---|---|---|
| JP | 04-276067 A | 10/1992 |
| JP | 05-152216 A | 6/1993 |
| JP | 10-255999 A | 9/1998 |

* cited by examiner

*Primary Examiner* — Rudy Zervigon
(74) *Attorney, Agent, or Firm* — Arent Fox LLP

(57) ABSTRACT

A plasma processing apparatus for processing an object to be processed using a plasma. The apparatus includes a processing chamber defining a processing cavity for containing an object to be processed and a process gas therein, a microwave radiating antenna having a microwave radiating surface for radiating a microwave in order to excite a plasma in the processing cavity, and a dielectric body provided so as to be opposed to the microwave radiating surface, in which the distance D between the microwave radiating surface and a surface of the dielectric body facing away from the microwave radiating surface, which is represented with the wavelength of the microwave being a distance unit, is determined to be in the range satisfying the inequality $0.7 \times n/4 \leq D \leq 1.3 \times n/4$ (n being a natural number).

23 Claims, 4 Drawing Sheets

PLASMA PROCESSING APPARATUS AND PLASMA PROCESSING METHOD

BACKGROUND OF THE INVENTION

1. Field of the Invention

The present invention relates to a plasma processing apparatus and a plasma processing method for processing an object to be processed such as a semiconductor substrate or the like with a plasma excited by radiating a microwave.

2. Description of Related Art

In a work for manufacturing a semiconductor device, a surface quality modifying process for modifying the surface material quality by nitriding or oxidizing the wafer surface, an ashing process for removing resist, a layer forming process for forming a thin layer by depositing materials such as an insulating material or the like on the wafer surface and an etching process for processing the thin layer formed on the wafer surface into minute patterns are carried out. Attention has been paid to an RLSA (Radial Line Slot Antenna) plasma processing apparatus as an apparatus for carrying out these processes.

An RLSA plasma processing apparatus comprises a processing chamber having an opened upper surface, and a dielectric plate disposed as closing the opened upper surface of the processing chamber. A cavity defined by the processing chamber and the dielectric plate serves as a processing cavity for plasma processing a semiconductor wafer as an object to be processed. Provided in the processing cavity is a wafer stage for mounting and holding a semiconductor wafer thereon. Further, disposed above the dielectric plate is a radial line slot antenna for radiating a microwave through the dielectric plate into the processing cavity.

For example, in the case of nitriding the surface of a semiconductor wafer using such an RLSA plasma processing apparatus, first, the semiconductor wafer is mounted on the wafer stage with the surface of the semiconductor wafer directed upwardly. Next, a process gas (for example, Ar/NH$_3$) is supplied into the processing cavity, and thereafter a microwave is radiated from the radial line slot antenna toward the processing cavity. Thereby, a plasma of the process gas is generated in the processing cavity, and the surface of the semiconductor wafer mounted on the wafer stage is nitrided by the generated plasma.

The radial line slot antenna has a number of slots formed so as to be distributed in the whole region of the lower surface of the antenna, so that the microwave is radiated from the number of the slots. Consequently, in an RLSA plasma processing apparatus using such a radial line slot antenna, since a microwave can be radiated substantially uniformly in the processing cavity, a plasma of a process gas can be uniformly generated. Therefore, it is expected that the surface of a semiconductor wafer can be uniformly processed with the plasma.

However, in a conventional RLSA plasma processing apparatus, since the density of a plasma generated in the processing cavity is low, the processing rate is low. Consequently, such a conventional RLSA plasma processing apparatus cannot be used for manufacturing a semiconductor device in practice.

SUMMARY OF THE INVENTION

An object of the present invention is to provide a plasma processing apparatus capable of generating a high density plasma.

Another object of the present invention is to provide a plasma processing method capable of processing an object to be processed with a high density plasma.

A plasma processing apparatus according to the present invention is one in which a microwave is radiated from a microwave radiating antenna to a processing cavity containing an object to be processed and a process gas therein, thereby to excite a plasma at a plasma exciting surface spaced from a microwave radiating surface of the microwave radiating antenna by a predetermined distance, so that the object is processed with the excited plasma. In a plasma processing apparatus according to the present invention, a dielectric body is provided so as to be opposed to the microwave radiating surface, and the distance D between the microwave radiating surface and the surface of the dielectric body facing away from the microwave radiating surface, which is represented with the wavelength of the microwave being a distance unit, is determined to be in the range satisfying the following inequality $$0.7 \times n/4 \leq D \leq 1.3 \times n/4 \text{ (n being a natural number)}$$

(preferably in the range of $0.8 \times n/4 \leq D \leq 1.2 \times n/4$, and more preferably in the range of $0.9 \times n/4 \leq D \leq 1.1 \times n/4$).

The distance D is preferably determined in the range of $0.7 \times n/2 \leq D \leq 1.3 \times n/2$ (more preferably in the range of $0.8 \times n/2 \leq D \leq 1.2 \times n/2$, much more preferably in the range of $0.9 \times n/2 \leq D \leq 1.1 \times n/2$).

Further, it is preferable that a standing wave of the microwave is formed between the microwave radiating surface and the plasma exciting surface, and a plasma is excited at the plasma exciting surface by being supplied with energy from this standing wave of the microwave.

According to the present invention described above, by setting the distance D between the microwave radiating surface and the plasma exciting surface (substantially coinciding with the surface of the dielectric body facing away from the microwave radiating surface), which is represented with the wavelength of the microwave being a distance unit, in the range satisfying the above-mentioned inequality (namely, to be a value near n/4, and more preferably a value near n/2), a favorable standing wave can be formed in the region between the microwave radiating surface and the plasma exciting surface, and thereby a high density plasma can be generated in the processing cavity. Consequently, such a plasma processing apparatus can be appropriately used for manufacturing a semiconductor device or the like.

It is preferable that a dielectric plate is interposed between the microwave radiating surface and the plasma exciting surface. In this case, if the distance between the dielectric plate and the microwave radiating surface is minute, the thickness d of the dielectric plate may be determined in the range satisfying the following inequality $$0.7 \times n/4 \leq d \leq 1.3 \times n/4 \text{ (wherein d is a thickness represented with the wavelength of the microwave being a unit),}$$

(preferably in the range of $0.8 \times n/4 \leq d \leq 1.2 \times n/4$, and more preferably in the range of $0.9 \times n/4 \leq d \leq 1.1 \times n/4$).

In the above-mentioned case, the thickness d of the dielectric plate is further preferably determined in the range of $0.7 \times n/2 \leq d \leq 1.3 \times n/2$, (more preferably in the range of $0.8 \times n/2 \leq d \leq 1.2 \times n/2$, and much more preferably in the range of $0.9 \times n/2 \leq d \leq 1.1 \times n/2$). The above-mentioned microwave radiating antenna may be a radial line slot antenna provided with a number of slots for radiating a microwave formed and distributed in the microwave radiating surface thereof. In this case, it is preferable that a part of the number of slots is closed so that a plasma generated in the processing cavity is uniform in a plane.

With this structure, by closing a part of the slots formed in the lower surface of the radial line slot antenna to control the strength distribution of a microwave radiated from the radial line slot antenna, the uniformization in a plane of the density distribution of the plasma generated in the processing cavity as well as the heightening of the plasma density can be achieved. Thereby, it is possible to apply a substantially uniform plasma process to a surface of an object to be processed in a shorter time than that by a conventional apparatus.

The foregoing and other objects, features, aspects and advantages of the present invention will become more apparent from the following detailed description of embodiments of the present invention given with the accompanying drawings.

DESCRIPTION OF THE PREFERRED EMBODIMENTS

Figure 1:
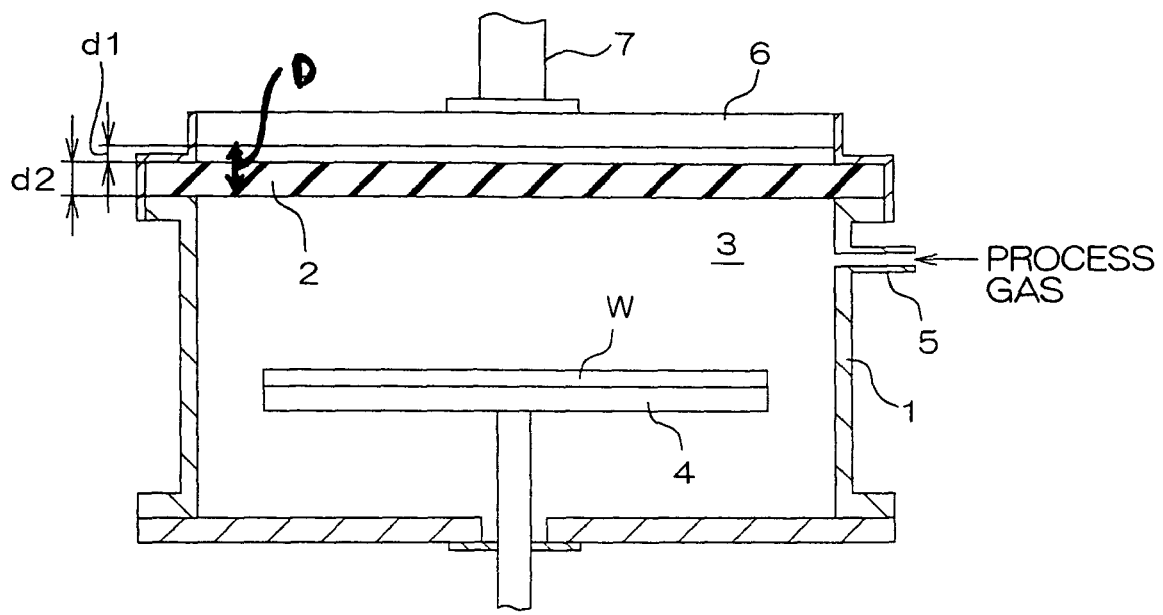
FIG. 1 is a schematic sectional view showing a construction of a plasma nitriding apparatus according to an embodiment of the present invention.

FIG. 1 is a schematic sectional view showing a construction of a plasma nitriding apparatus according to an embodiment of the present invention. The plasma nitriding apparatus is constructed to modify the quality of a surface of a semiconductor W as an object to be processed to a nitride, and used, for example, in a step for modifying a surface of a semiconductor consisting of Si (silicon) to $Si_3N_4$ to form an insulating layer, or the like.

The plasma nitriding apparatus comprises a cylindrical processing chamber 1 having an opened upper surface and a closed bottom. A dielectric plate 2 made of e.g. quartz is provided at the upper portion of the processing chamber 1 as closing the opened upper surface of the processing chamber 1, so that a sealed processing cavity 3 is defined below the dielectric plate 2. Within the processing cavity 3, a wafer stage 4 is disposed on which the semiconductor wafer W is mounted and held. Further, a gas introducing pipe 5 for introducing a process gas into the processing cavity 3 is connected to a side wall of the processing chamber 1. As the process gas, for example, $Ar/NH_3$, $Ar/N_2/H_2$ or the like can be used.

Figure 2:
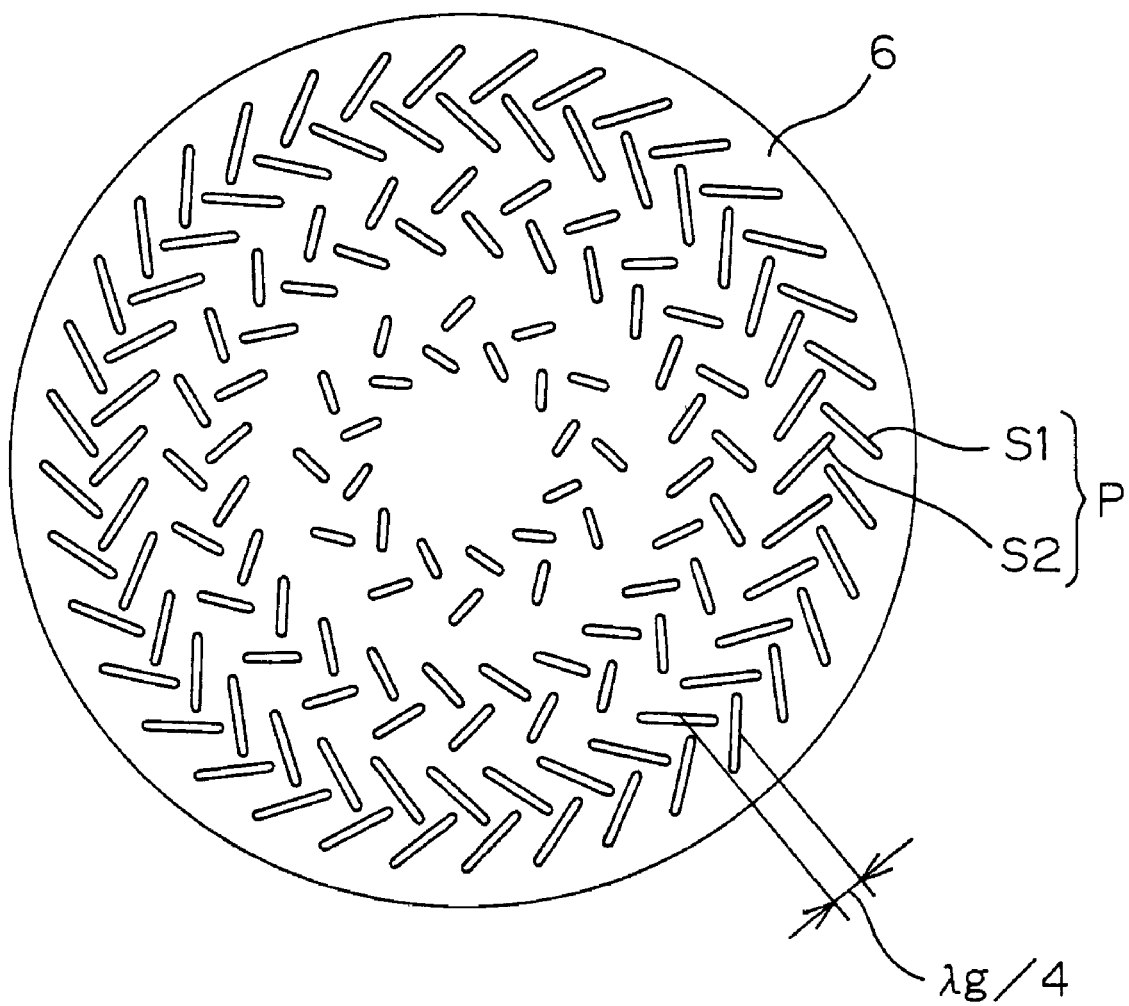
FIG. 2 is a view showing a lower surface of a radial line slot antenna.

Above the dielectric plate 2, a radial line slot antenna 6 is provided at a position spaced with a distance d1 from the upper surface of the dielectric plate 2 and in opposition thereto. The radial line slot antenna 6 is a plate-shaped antenna having therein an insulating plate capable of transmitting microwaves. In the lower surface of the radial line slot antenna 6, a number of slot pairs P are concentrically arranged as shown in FIG. 2. Each slot pair P comprises a pair of slots S1, S2 oriented in two directions intersecting with each other respectively. These slots S1, S2 form substantially T shape with being spaced from each other with a distance corresponding to ¼ of the wavelength λg of a microwave in the radial line slot antenna 6 (¼ guide wavelength=¼ λg).

On the other hand, connected to the upper surface of the radial line slot antenna 6 is a microwave guide 7 for guiding a microwave oscillated from an unshown microwave oscillator to the insulating plate. As the microwave guide, e.g. a coaxial microwave guide can be used.

In the case of nitriding the surface of the semiconductor wafer W, to begin with, the semiconductor wafer W is mounted on the wafer stage 4 with the surface thereof directed upwardly. Then, an atmosphere in the processing cavity 3 is exhausted by an unshown exhausting mechanism. After the processing cavity 3 becomes in a substantially vacuum state, a process gas is introduced through the gas introducing pipe 5 into the processing cavity 3. Thereafter, with the processing cavity 3 being filled with the process gas, a microwave having a frequency of, for example, 2.45 GHz is generated from the unshown oscillator, and the microwave is transmitted through the microwave guide 7 in TEM mode to be introduced into the radial line slot antenna 6.

The microwave introduced into the radial line slot antenna 6 is transmitted through the insulating plate in the radial line slot antenna 6, and in the midway thereof, the microwave leaks from the slot pairs P to be radiated toward the dielectric plate 2, and further, after passing through the dielectric plate 2, it is radiated to the processing cavity 3. A plasma of the process gas in the processing cavity 3 is excited by the energy of the microwave radiated to the processing cavity 3, and the surface of the semiconductor wafer W is processed by the plasma of the process gas.

When the electron density in the plasma generated in the processing cavity 3 becomes equal to or more than a density capable of shielding the microwave (cutoff density), the microwave passing through the dielectric plate 2 is reflected by the time when it has entered into the processing cavity 3 by a minute distance (skin depth) from the lower surface of the dielectric plate 2. As a result, a standing wave of the microwave is formed in a region between the lower surface (microwave radiating surface) of the radial line slot antenna 6 and a surface (microwave reflecting surface) formed by the reflecting ends of the microwave. After that, the microwave reflecting surface becomes a plasma exciting surface, and a stable plasma is excited on the plasma exciting surface.

Therefore, it is thinkable that when the electron density in a plasma becomes equal to or more than the cutoff density, the density of a plasma generated in the processing cavity 3 is influenced by a standing wave formed between the lower surface of the radial line slot antenna 6 and the plasma exciting surface. The applicants of the present invention have thought that the density of a plasma generated in the processing cavity 3 can be heightened by appropriately setting the distance between the lower surface of the radial line slot antenna 6 and the lower surface of the dielectric plate 2 so as to form a favorable standing wave in the region between the under surface of the radial line slot antenna 6 and the plasma exciting surface.

That is, in the conventional RLSA plasma processing apparatus, the distance between the lower surface of the radial line slot antenna 6 and the lower surface of the dielectric plate 2 is set independently of the wavelength of the microwave. In the plasma nitriding apparatus (plasma processing apparatus) according to the present invention, on the other hand, the distance d1 between the lower surface of the radial line slot antenna 6 and the upper surface of the dielectric plate 2 and the thickness d2 of the dielectric plate 2 are set in such a manner that the distance D between the lower surface of the radial line slot antenna 6 and the lower surface (capable of being regarded substantially as the plasma exciting surface) of the dielectric plate 2, which is represented with the wavelength of the microwave being a distance unit, is equal to approximately ½. In this embodiment, for example, the distance d1 between the lower surface of the radial line slot antenna 6 and the upper surface of the dielectric plate 2 is set to be 6 mm and the thickness d2 of the dielectric plate 2 is set to be 30 mm.

Letting the wavelength of the microwave in the air be $\lambda_0$ and letting the wavelength of the microwave in the dielectric plate 2 be $\lambda$, the distance D between the lower surface of the radial line slot antenna 6 and the lower surface of the dielectric plate 2 is represented by the following formula (1) with the wavelength of the microwave being a distance unit.

$$D=(d1/\lambda_0)+(d2/\lambda) \qquad (1)$$

Letting the dielectric constant of the dielectric plate 2 be $\in_\gamma$, the wavelength $\lambda$ in the dielectric plate 2 is represented by the following formula (2).

$$\lambda=\lambda_0\sqrt{\in_\gamma} \qquad (2)$$

Therefore, the above-mentioned distance D can be represented by the following formula (3).

$$D=(d1+d2\sqrt{\in_\gamma})/\lambda_0 \qquad (3)$$

Consequently, by substituting the dielectric constant $\in_\gamma=3.9$ of the dielectric plate 2 made of quartz and the wavelength $\lambda_0=122$ (mm) in the air (in the vacuum) of the microwave having a wavelength of 2.45 GHz into the above-mentioned formula (3), it can be recognized that the distance D between the lower surface of the radial line slot antenna 6 and the lower surface of the dielectric plate 2, which is represented with the wavelength of the microwave being a distance unit, is set to be approximately 0.53.

Figure 3:
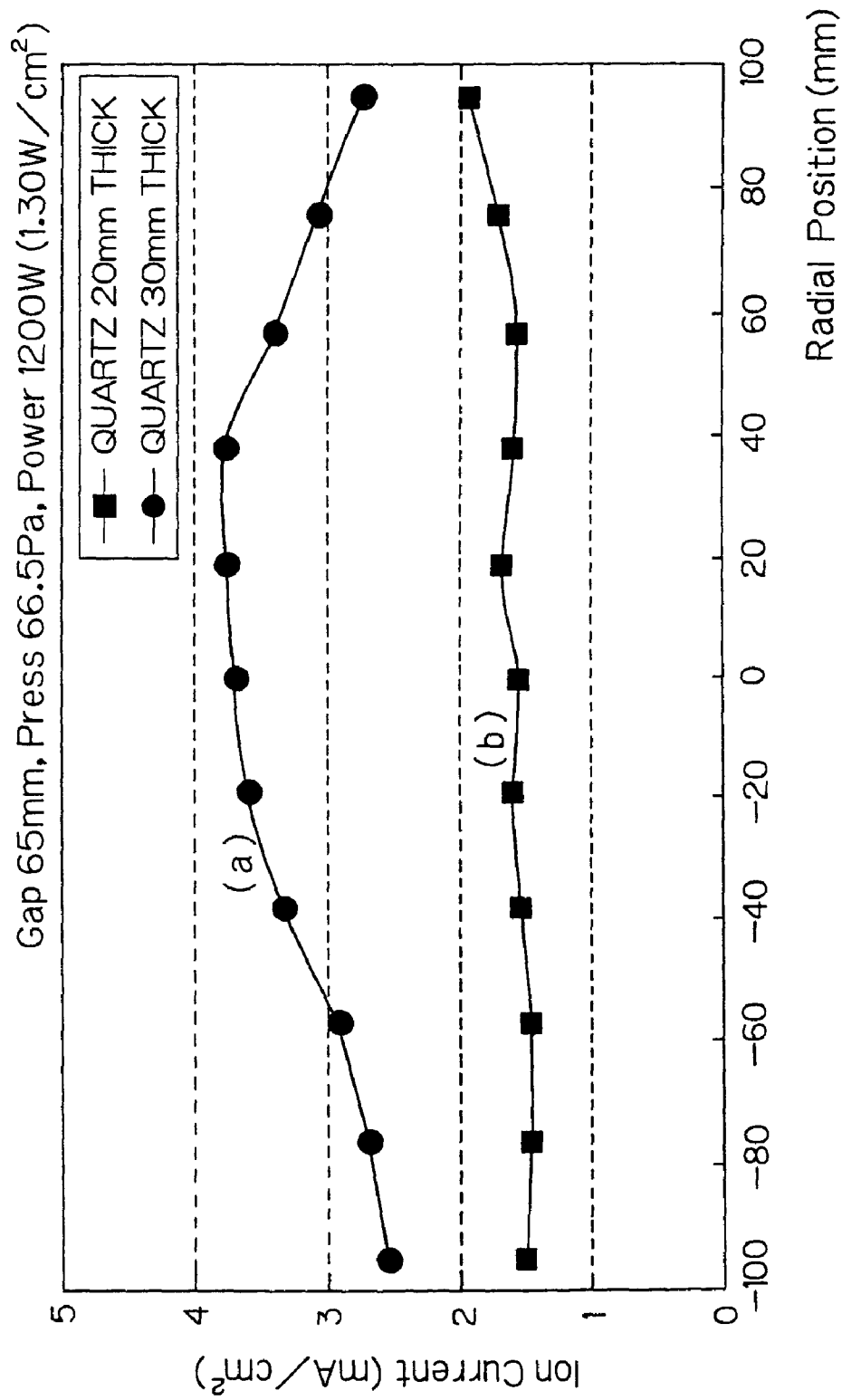
FIG. 3 is a graph showing the density distributions of ion current incident on the surface of a semiconductor wafer (a) when the thickness d2 of the dielectric plate is set to be 30 mm and (b) when the thickness d2 of the dielectric plate is set to be 20 mm (in the case of the conventional apparatus).

FIG. 3 is a graph showing the density distributions of ion current incident on the surface of a semiconductor wafer (a) when the thickness d2 of the dielectric plate 2 is set to be 30 mm and (b) when the thickness d2 of the dielectric plate 2 is set to be 20 mm (in the case of the conventional apparatus). Each of the line graphs (a), (b) shows the result of examination of the ion current density distribution in a plasma excited by introducing a microwave having a frequency of 2.45 GHz and an electric power of 1200 W into a radial line slot antenna 6 with the distance d1 between the lower surface of the radial line slot antenna 6 and the upper surface of the dielectric plate 2 being set to be 6 mm, the distance between the lower surface of the dielectric plate 2 and the surface of the semiconductor wafer W being set to be 65 mm, and the air pressure in the processing cavity 3 being set to be 66.5 Pa.

By comparing the line graphs (a), (b) in FIG. 3 with each other, it is understood that the ion current density (plasma density) on the semiconductor wafer W in the case of the thickness d2 of the dielectric plate 2 being set to be 30 mm is lager than that in the case of the thickness d2 of the dielectric plate 2 being set to be 20 mm.

However, in the case of the thickness d2 of the dielectric plate 2 being set to be 20 mm, the ion current density distribution on the surface of the semiconductor wafer W is substantially uniform, and on the other hand, in the case of the thickness d2 of the dielectric plate 2 being set to be 30 mm, the ion current incident in a region near the center of the semiconductor wafer W is larger than that incident in a region near the periphery of the semiconductor wafer W, so that the ion current density distribution is not uniform in a plane.

Therefore, in this embodiment, the density distribution of the ion current incident on the surface of the semiconductor wafer W is uniformized by closing a part of the slot pairs P formed in the lower surface of the radial line slot antenna 6 to control the strength distribution of the microwave incident on the surface of semiconductor wafer W. In concrete, by closing ⅙ or ⅓ of the slot pairs arranged in the outermost peripheral part of the lower surface of the radial line slot antenna 6, the density distribution of the ion current incident on the surface of the semiconductor wafer W is uniformized.

In the above-mentioned description, "closing ⅙ of the slot pairs" means to close one slot pair P per six slot pairs P arranged in the peripheral direction, and "closing ⅓ of the slot pairs" means to close one slot pair P per three slot pairs P arranged in the peripheral direction.

Figure 4:
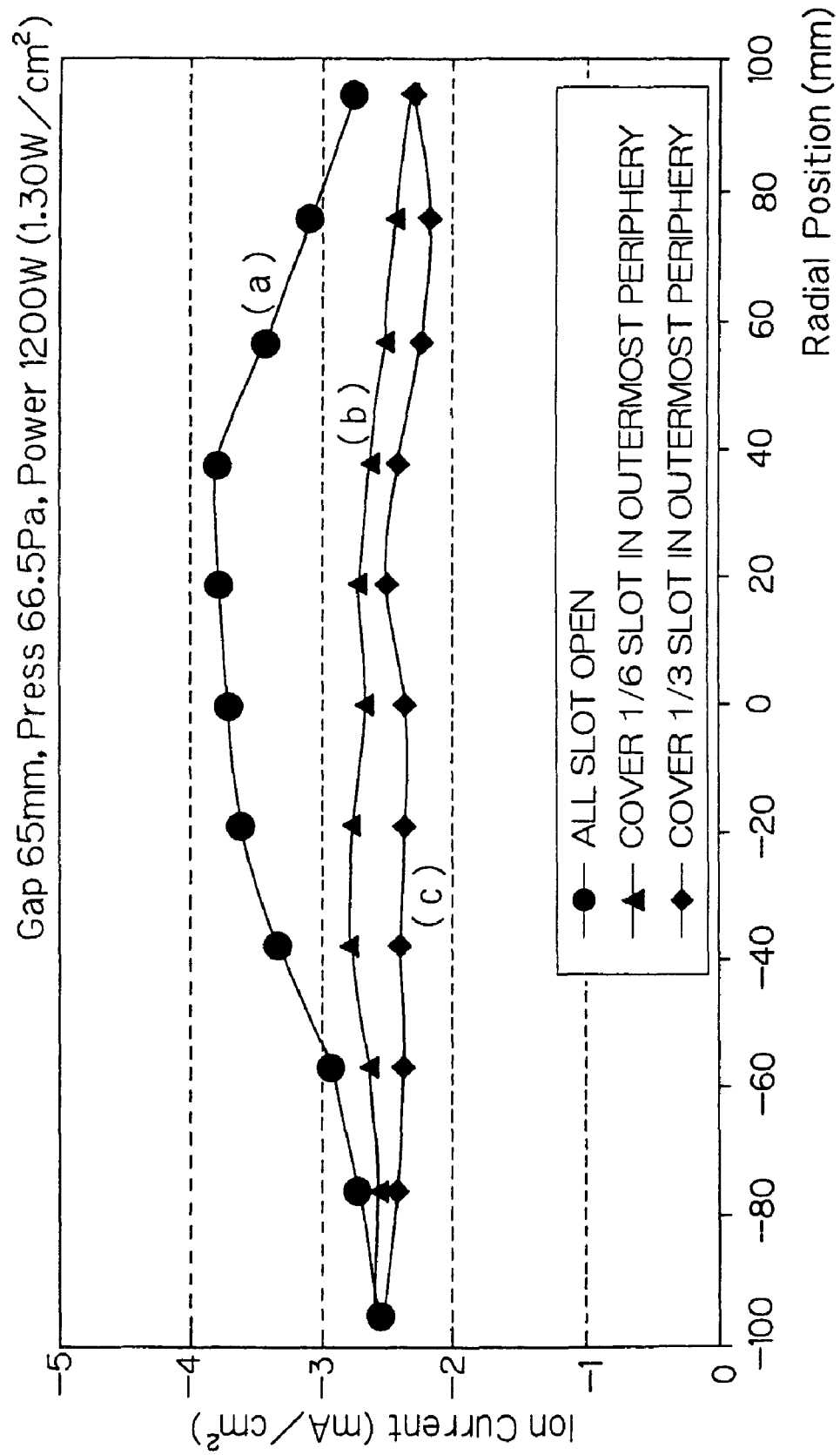
FIG. 4 is a graph showing the density distributions of ion current incident on the surface of a semiconductor wafer W (a) in the case of not closing any slot pair, (b) in the case of closing ⅙ of the slot pairs arranged in the outermost peripheral part, and (c) in the case of closing ⅓ of the slot pairs arranged in the outermost peripheral part.

FIG. 4 is a graph showing the density distributions of ion current incident on the surface of a semiconductor wafer W (a) in the case of not closing any slot pair P, (b) in the case of closing ⅙ of the slot pairs P arranged in the outermost peripheral part, and (c) in the case of closing ⅓ of the slot pairs P arranged in the outermost peripheral part. Each of the line graphs (a), (b), (c) shows the result of examination of the ion current density distribution in a plasma excited by introducing a microwave having a frequency of 2.45 GHz and an electric power of 1200 W into a radial line slot antenna 6 with the distance d1 between the lower surface of the radial line slot antenna 6 and the upper surface of the dielectric plate 2 being set to be 6 mm, the thickness d2 of the dielectric plate 2 being set to be 30 mm, the distance between the lower surface of the dielectric plate 2 and the surface of the semiconductor wafer W being set to be 65 mm, and the air pressure in the processing cavity 3 being set to be 66.5 Pa.

From this FIG. 4, it is understood that the density distribution of the ion current incident on the surface of the semiconductor wafer W is uniformized by closing ⅙ or ⅓ of the slot pairs P arranged in the outermost peripheral part of the lower surface of the radial line slot antenna 6.

As above-mentioned, in this embodiment, a high density plasma generation in the processing cavity 3 can be achieved by appropriately setting the distance d1 between the lower surface of the radial line slot antenna 6 and the upper surface of the dielectric plate 2 and the thickness d2 of the dielectric plate 2 in such a manner that the distance D between the lower surface of the radial line slot antenna 6 and the lower surface of the dielectric plate 2, which is represented with the wavelength of the microwave being a distance unit, becomes approximately ½. Accordingly, this plasma nitriding apparatus can be favorably used for applying nitriding process to a surface of a semiconductor wafer W to manufacture a semiconductor device.

Further, in this embodiment, by closing a part of the slot pairs P formed in the lower surface of the radial line slot antenna 6 to control the strength distribution of a microwave radiated from the radial line slot antenna 6, the uniformization of the density distribution of ion current incident on the surface of a semiconductor wafer W held on the wafer stage 4 as well as the heightening of the ion current density (plasma density) can be achieved. Thereby, it is possible to apply a substantially uniform plasma nitriding process to a surface of a semiconductor wafer W in a shorter time than that by a conventional apparatus.

In this embodiment, the dielectric plate 2 is made of quartz, and the distance d1 between the lower surface of the radial line slot antenna 6 and the upper surface of the dielectric plate 2 is set to be 6 mm, with the thickness d2 of the dielectric plate 2 being set to be 30 mm. However, the dielectric plate 2 may be made of a dielectric material other than quartz such as alumina ($Al_2O_3$) or aluminum nitride (AlN). Further, the values of the above-mentioned distance d1 and the thickness d2 may be appropriately changed. For example, there is a case in which the dielectric plate 2, made of a material having a large heat conductivity, efficiently transfers heat generated by the re-coupling of ions and electrons in a plasma to the chamber wall, and thereby the radial line slot antenna 6 can be prevented from being heated to a high temperature. In this case, with the distance d1 between the lower surface of the radial line slot antenna 6 and the upper surface of the dielectric plate 2 being preferably set to be 0 mm, the radial line slot antenna 6 may be in contact with the dielectric plate 2.

Now, shown in the following TABLE 1 are examples of the materials of the dielectric plate 2 and the combinations of the above-mentioned distance d1 and the thickness d2 for making the distance D between the lower surface of the radial line slot antenna 6 and the lower surface of the dielectric plate 2, which is represented with the wavelength of the microwave being a distance unit, approximately ½.

TABLE 1

| material of dielectric plate | distance d1 | thickness d2 |
|---|---|---|
| quartz | 0 mm | 30.9 mm |
| (dielectric constant = 3.9) | 1.8 mm | 30 mm |
| aluminum nitride | 0 mm | 20.6 mm |
| (dielectric constant = 8.8) | 4.6 mm | 19 mm |
| alumina | 0 mm | 19.5 mm |
| (dielectric constant = 9.8) | 4.7 mm | 18 mm |

Further, in this embodiment, it is described that the distance d1 between the lower surface of the radial line slot antenna 6 and the upper surface of the dielectric plate 2 and the thickness d2 of the dielectric plate 2 are preferably set in such a manner that the distance D between the lower surface of the radial line slot antenna 6 and the lower surface of the dielectric plate 2, which is represented with the wavelength of the microwave being a distance unit, becomes approximately ½. However, the above-mentioned distance d1 and the thickness d2 may be set in such a manner that the above-mentioned distance D becomes an integral multiple of approximately ½. Furthermore, the above-mentioned distance d1 and the thickness d2 may be set in such a manner that the above-mentioned distance D becomes an integral multiple of approximately ¼.

That is, for the purpose of forming a favorable standing wave in the region between the lower surface of the radial line slot antenna 6 and the plasma exciting surface to generate a high density plasma in the processing cavity 3, the distance D between the lower surface of the radial line slot antenna 6 and the lower surface of the dielectric plate 2, which is represented with the wavelength of the microwave being a distance unit, has only to satisfy the inequality $0.7 \times n/4 \leq D \leq 1.3 \times n/4$ (n being a natural number).

Further, the present invention can be embodied in other forms. For example, in the above-mentioned embodiment, a plasma nitriding apparatus is described as an example, the present invention is not limited to such a plasma nitriding apparatus but can be widely applied to apparatus for plasma processing an object to be processed, for example, a plasma CVD (Chemical Vapor Deposition) apparatus, a plasma ashing apparatus, a plasma etching apparatus, a plasma oxidizing apparatus and the like.

When the present invention is applied to a plasma CVD apparatus, for example, $Ar/SiH_4$, $TEOS/O_2$ or the like can be used as a process gas. Further, when the present invention is applied to a plasma ashing apparatus, for example, $O_2$, $Ar/O_2$, $Kr/O_2$ or the like can be used as a process gas. Further, when the present invention is applied to a plasma etching apparatus, for example, $Cl_2$, HBr or the like can be used as a process gas (etching gas). Furthermore, when the present invention is applied to a plasma oxidizing apparatus, for example, $Kr/O_2$, $Ar/O_2$ or the like can be used as a process gas.

Although the present invention has been described and illustrated in detail, it is clearly understood that the same is by way of illustration and example only and is not to be taken by way of limitation, the spirit and scope of the present invention being limited only by the terms of the appended claims.

This application corresponds to the Japanese Patent Application No.2000-156535 filed in the Japanese Patent Office on May 26, 2000, and the whole disclosure of the Japanese application is incorporated herein by reference.

What is claimed is:

1. A plasma processing apparatus for processing an object using a plasma, comprising:
   a processing chamber defining a processing cavity for containing an object to be processed and a process gas therein;
   a microwave radiating antenna having a microwave radiating surface for radiating a microwave in order to excite a plasma in the processing cavity; and
   a dielectric body provided so as to be opposed to the microwave radiating surface;
   wherein no additional microwave radiating antenna is placed between the microwave radiating antenna and the dielectric body;
   wherein a distance D between the microwave radiating surface and a surface of the dielectric body facing away from the microwave radiating surface, which is represented with a wavelength of the microwave being a distance unit, is determined to be in a range satisfying an inequality $0.7 \times n/4 \leq D \leq 1.3 \times n/4$ (n being a natural number);

whereby a standing wave of the microwave is formed between the microwave radiating surface and a plasma exciting surface, thereby exciting a plasma at the plasma exciting surface by being supplied with energy from the standing wave of the microwave, the plasma exciting surface substantially coinciding with the surface of the dielectric body facing away from the microwave radiating surface, the plasma being formed between the plasma exciting surface and the object to be processed, the standing wave not entering the plasma,
   wherein one end of the standing wave is positioned on the plasma exciting surface.

2. A plasma processing apparatus for processing an object using a plasma, comprising:
   a process chamber defining a processing cavity for containing an object to be processed and a process gas therein;
   a microwave radiating antenna having a microwave radiating surface for radiating a microwave in order to excite a plasma in the processing cavity; and
   a dielectric body provided so as to be opposed to the microwave radiating surface;
   wherein no additional microwave radiating antenna is located between the microwave radiating antenna and the dielectric body;
   wherein a distance D between the microwave radiating surface and a surface of the dielectric body facing away from the microwave radiating surface, which is represented with a wavelength of the microwave being a distance unit, is determined to be in a range satisfying an inequality $$0.7 \times n/2 \leq D \leq 1.3 \times n/2 \text{ (n being a natural number)};$$

whereby a standing wave of the microwave is formed between the microwave radiating surface and a plasma exciting surface, thereby exciting a plasma at the plasma exciting surface by being supplied with energy from the standing wave of the microwave, the plasma exciting surface substantially coinciding with the surface of the dielectric body facing away from the microwave radiating surface, the plasma being formed between the plasma exciting surface and the object to be processed, the standing wave not entering the plasma, wherein one end of the standing wave is positioned on the plasma exciting surface.

3. The plasma processing apparatus as claimed in claim 1, in which the dielectric body is a plate-shaped member disposed in such a manner that a distance between the dielectric plate and the plasma radiating surface is substantially zero, and a thickness d of the dielectric plate represented with the wavelength of the microwave being a distance unit is determined to be in a range satisfying an inequality $$0.7 \times n/4 \leq d \leq 1.3 \times n/4 \text{ (n being a natural number)}.$$

4. The plasma processing apparatus as claimed in claim 2, in which the dielectric body is a plate-shaped member disposed in such a manner that a distance between the dielectric plate and the plasma radiating surface is substantially zero, and a thickness d of the dielectric plate represented with the wavelength of the microwave being a distance unit is determined to be in a range satisfying an inequality $$0.7 \times n/2 \leq d \leq 1.3 \times n/2 \text{ (n being a natural number)}.$$

5. The plasma processing apparatus as claimed in claim 1, in which
the microwave radiating antenna is a radial line slot antenna having a number of slots formed and distributed in the microwave radiating surface thereof for radiating the microwave.

6. The plasma processing apparatus according to claim 1, wherein the microwave radiating antenna is a radial line slot antenna having a number of slots formed and distributed in the microwave radiating surface thereof for radiating the microwave, the number of the slots being concentrically arranged in the microwave radiating surface; and
wherein one per six or three slots in the peripheral direction of the slots arranged in the outermost peripheral part are closed so as to uniformize, in a plane, the plasma generated in the processing cavity.

7. A plasma processing method for processing an object using a plasma, the method comprising the steps of:
putting an object to be processed and a process gas into a processing cavity defined in a processing chamber;
radiating a microwave for exciting a plasma from a microwave radiating antenna having a microwave radiating surface to the processing cavity;
providing a dielectric body so as to be opposed to the microwave radiating surface; and
determining a distance D between the microwave radiating surface and a surface of the dielectric body facing away from the microwave radiating surface, which is represented with a wavelength of the microwave being a distance unit, to be in a range satisfying an inequality $$0.7 \times n/4 \leq D \leq 1.3 \times n/4 \text{ (n being a natural number)},$$

whereby a standing wave of the microwave is formed between the microwave radiating surface and a plasma exciting surface, thereby exciting a plasma at the plasma exciting surface by being supplied with energy from the standing wave of the microwave, the plasma exciting surface substantially coinciding with the surface of the dielectric body facing away from the microwave radiating surface, the plasma being formed between the plasma exciting surface and the object to be processed, the standing wave not entering the plasma, wherein one end of the standing wave is positioned on the plasma exciting surface, and wherein no additional microwave radiating antenna is located between the microwave radiating antenna and the dielectric body.

8. A plasma processing method for processing an object using a plasma, the method comprising the steps of:
putting an object to be processed and a process gas into a processing cavity defined in a processing chamber;
radiating a microwave for exciting a plasma from a microwave radiating antenna having a microwave radiating surface to the processing cavity;
providing a dielectric body so as to be opposed to the microwave radiating surface; and
determining a distance D between the microwave radiating surface and a surface of the dielectric body facing away from the microwave radiating surface, which is represented with a wavelength of the microwave being a distance unit, to be in a range satisfying an inequality $$0.7 \times n/2 \leq D \leq 1.3 \times n/2 \text{ (n being a natural number)},$$

whereby a standing wave of the microwave is formed between the microwave radiating surface and a plasma exciting surface, thereby exciting a plasma at the plasma exciting surface by being supplied with energy from the standing wave of the microwave, the plasma exciting surface substantially coinciding with the surface of the dielectric body facing away from the microwave radiating surface, the plasma being formed between the plasma exciting surface and the object to be processed, the standing wave not entering the plasma, wherein one end of the standing wave is positioned on the plasma exciting surface, and wherein no additional microwave radiating antenna is located between the microwave radiating antenna and the dielectric body.

9. The plasma processing apparatus as claimed in claim 5, in which
a part of the number of slots is closed so as to uniformize, in a plane, the plasma generated in the processing cavity.

10. The plasma processing method as claimed in claim 7, in which the microwave radiating antenna is a radial line slot antenna having a number of slots formed and distributed in the microwave radiating surface thereof for radiating the microwave.

11. The plasma processing method as claimed in claim 10, further comprising:
a step of closing a part of the number of slots so as to uniformize, in a plane, the plasma generated in the processing cavity.

12. The plasma processing method as claimed in claim 11, wherein the number of the slots are concentrically arranged in the microwave radiating surface; and
wherein the step of closing the slots includes the step of closing one per six or three slots in the peripheral direction of the slots arranged in the outermost peripheral part.

13. A plasma processing apparatus for processing an object using a plasma, comprising:
- a processing chamber defining a processing cavity for containing an object to be processed and a process gas therein;
- a microwave radiating antenna having a microwave radiating surface for radiating a microwave in order to excite a plasma in the processing cavity, the microwave radiating antenna being a radial line slot antenna having a number of slots formed and distributed in the microwave radiating surface; and
- a dielectric body provided so as to be opposed to the microwave radiating surface,
- wherein no additional microwave radiating antenna is located between the microwave radiating antenna and the dielectric body;
- wherein a distance D between the microwave radiating surface and a surface of the dielectric body facing away from the microwave radiating surface, which is represented with a wavelength of the microwave being a distance unit, is determined to be in a range satisfying an inequality $$0.7 \times n/4 \leq D \leq 1.3 \times n/4 \text{ (n being a natural number),}$$

wherein one end of the standing wave is positioned on the plasma exciting surface.

14. A plasma processing apparatus for processing an object using a plasma, comprising:
- a processing chamber defining a processing cavity for containing an object to be processed and a process gas therein;
- a microwave radiating antenna having a microwave radiating surface for radiating a microwave in order to excite a plasma in the processing cavity, the microwave radiating antenna being a radial line slot antenna having a number of slots formed and distributed in the microwave radiating surface; and
- a dielectric body provided so as to be opposed to the microwave radiating surface,
- wherein no additional microwave radiating antenna is located between the microwave radiating antenna and the dielectric body;
- wherein a distance D between the microwave radiating surface and a surface of the dielectric body facing away from the microwave radiating surface, which is represented with a wavelength of the microwave being a distance unit, is determined to be in a range satisfying an inequality $$0.7 \times n/2 \leq D \leq 1.3 \times n/2 \text{ (n being a natural number),}$$

wherein one end of the standing wave is positioned on the plasma exciting surface.

15. The plasma processing apparatus as claimed in claim 13, in which the dielectric body is a plate-shaped member disposed in such a manner that a distance between the dielectric plate and the plasma radiating surface is substantially zero, and a thickness d of the dielectric plate represented with the wavelength of the microwave being a distance unit is determined to be in a range satisfying an inequality $$0.7 \times n/4 \leq d \leq 1.3 \times n/4 \text{ (n being a natural number).}$$

16. The plasma processing apparatus as claimed in claim 14, in which the dielectric body is a plate-shaped member disposed in such a manner that a distance between the dielectric plate and the plasma radiating surface is substantially zero, and a thickness d of the dielectric plate represented with the wavelength of the microwave being a distance unit is determined to be in a range satisfying an inequality $$0.7 \times n/2 \leq d \leq 1.3 \times n/2 \text{ (n being a natural number).}$$

17. The plasma processing apparatus according to claim 13, in which a part of the number of slots is closed so as to uniformize, in a plane, the plasma generated in the processing cavity.

18. The plasma processing apparatus according to claim 13, in which the number of the slots are concentrically arranged in the microwave radiating surface.

19. The plasma processing apparatus according to claim 18, wherein one per six or three slots in the peripheral direction of the slots arranged in the outermost peripheral part are closed so as to uniformize, in a plane, the plasma generated in the processing cavity.

20. A plasma processing method for processing an object using a plasma, the method comprising the steps of:
- putting an object to be processed and a process gas into a processing cavity defined in a processing chamber;
- radiating a microwave for exciting a plasma from a microwave radiating antenna having a microwave radiating surface to the processing cavity, the microwave radiating antenna being a radial line slot antenna having a number of slots formed and distributed in the microwave radiating surface;
- providing a dielectric body so as to be opposed to the microwave radiating surface; and
- determining a distance D between the microwave radiating surface and a surface of the dielectric body facing away from the microwave radiating surface, which is represented with a wavelength of the microwave being a distance unit, to be in a range satisfying an inequality $$0.7 \times n/4 \leq D \leq 1.3 \times n/4 \text{ (n being a natural number),}$$

wherein one end of the standing wave is positioned on the plasma exciting surface, and
wherein no additional microwave radiating antenna is placed between the microwave radiating antenna and the dielectric body.

21. A plasma processing method for processing an object using a plasma, comprising the steps of:
- putting an object to be processed and a process gas into a processing cavity defined in a processing chamber;
- radiating a microwave for exciting a plasma from a microwave radiating antenna having a microwave radiating surface to the processing cavity, the microwave radiating antenna being a radial line slot antenna having a number of slots formed and distributed in the microwave radiating surface;
- providing a dielectric body so as to be opposed to the microwave radiating surface; and
- determining a distance D between the microwave radiating surface and a surface of the dielectric body facing away from the microwave radiating surface, which is represented with a wavelength of the microwave being a distance unit, to be in a range satisfying an inequality $$0.7 \times n/2 \leq D \leq 1.3 \times n/2 \text{ (n being a natural number),}$$

wherein one end of the standing wave is positioned on the plasma exciting surface, and
wherein no additional microwave radiating antenna is placed between the microwave radiating antenna and the dielectric body.

22. The plasma processing method as claimed in claim 20, further comprising:

a step of closing a part of the number of slots so as to uniformize, in a plane, the plasma generated in the processing cavity.

23. The plasma processing method as claimed in claim 22, wherein the number of the slots are concentrically arranged in the microwave radiating surface; and wherein the step of closing the slots includes the step of closing one per six or three slots in the peripheral direction of the slots arranged in the outermost peripheral part.

* * * * *